US005426626A

United States Patent [19]

Katayama

[11] Patent Number: 5,426,626
[45] Date of Patent: Jun. 20, 1995

[54] PHOTODETECTING SYSTEM FOR A MAGNETO-OPTICAL DISK HEAD SYSTEM

[75] Inventor: Ryuichi Katayama, Tokyo, Japan

[73] Assignee: NEC Corporation, Tokyo, Japan

[21] Appl. No.: 836,848

[22] Filed: Feb. 19, 1992

[30] Foreign Application Priority Data

Feb. 19, 1991 [JP] Japan ................................. 3-024236

[51] Int. Cl.$^6$ .............................................. G11B 7/00
[52] U.S. Cl. ............................... 369/44.41; 369/44.14; 250/201.5; 250/214.1; 357/446
[58] Field of Search ............... 369/44.14, 44.41, 44.42, 369/44.23, 44.24, 110, 112, 120, 124; 250/201.5, 211 R, 211 J, 578.1, 214.1, 370.13; 357/30, 32; 347/3, 14, 19; 257/446

[56] References Cited

U.S. PATENT DOCUMENTS

| | | | |
|---|---|---|---|
| 3,955,082 | 5/1976 | Dyment | 250/211 J |
| 4,521,680 | 6/1985 | Ando | 369/44.42 |
| 4,603,410 | 7/1986 | Yoshida | 369/44.41 |
| 4,609,071 | 5/1987 | Minami et al. | 369/44.37 |
| 4,718,054 | 1/1988 | Schell et al. | 369/44.41 |
| 4,785,167 | 11/1988 | Madrid | 369/44.42 |
| 4,837,429 | 6/1989 | Umezawa et al. | 250/211 J |
| 4,972,400 | 11/1990 | Kuwabara et al. | 369/124 |
| 5,097,307 | 3/1992 | Bierhoff | 357/30 |
| 5,789,297 | 2/1993 | Ahlgren | 250/214.1 |

FOREIGN PATENT DOCUMENTS

| | | |
|---|---|---|
| 0075192 | 3/1983 | European Pat. Off. . |
| 0186044 | 7/1986 | European Pat. Off. . |
| 0304560 | 3/1989 | European Pat. Off. . |
| 0170058 | 10/1983 | Japan .................................. 257/446 |
| 60-113334 | 6/1985 | Japan . |
| 0139061 | 6/1986 | Japan .................................. 257/446 |
| 0141176 | 6/1986 | Japan .................................. 257/446 |

Primary Examiner—Aristotelis Psitos
Assistant Examiner—Thang V. Tran
Attorney, Agent, or Firm—Sughrue, Mion, Zinn, Macpeak & Seas

[57] ABSTRACT

A magneto-optical disk head system includes a laser light source for emitting a laser light, an optical system for focusing the laser light emitted from the laser light source on a magneto-optical disk, an optical separating system for separating a reflection light of the laser light reflected at the magneto-optical disk to a plurality of polarized lights having orthogonal polarization directions, and a photodetector for detecting the polarized lights. The photodetector includes a plurality of photodetecting segments isolated from each other. An information signal of the magneto-optical disk is detected through cathodes of the photodetecting segments, while focusing and tracking error signals thereof are detected through anodes of the photodetecting segments.

8 Claims, 12 Drawing Sheets

PHOTODETECTING SYSTEM FOR A MAGNETO-OPTICAL DISK HEAD SYSTEM

FIELD OF THE INVENTION

This invention relates to a magneto-optical disk head system, and more particularly to, a magneto-optical disk head system for recording (writing), reading and erasing data to or from a magneto-optical disk.

BACKGROUND OF THE INVENTION

A first conventional magneto-optical disk head system has been disclosed in the text 29p-N-2 of Extended Abstracts (The 51th Autumn Meeting, 1990): The Japan Society of Applied Physics. The first conventional magneto-optical disk head system includes a semiconductor laser, an optical system including a collimator lens and an objective lens for focusing the laser light on a magneto-optical disk, a beam splitter, a half-wave plate, a polarizing beam splitter and a photodetector.

In operation, a laser light emitted from the semiconductor laser is transmitted through an optical system consisting of the beam splitter and the collimator and objective lenses to be focused on a magneto-optical disk. A reflection light of the laser light reflected at the magneto-optical disk reaches the beam splitter at which the reflection light changes its direction toward the half-wave plate. The half-wave plate rotates the polarization plane of the reflection light by 45 degrees to spatially separate the reflection light to P-polarized and S-polarized lights which have orthogonal polarization directions. The P-polarized and S-polarized lights are detected separately by the photodetector via the polarizing beam splitter.

Tile photodetector of the first conventional magneto-optical disk head system includes an N-layer grown by epitaxy on an N+-silicon substrate, and two P-layers formed within the N-layer. The two P-layers compose two islanded segment regions for detecting the P-polarized and S-polarized lights, respectively. Each islanded segment region consists of several photodetecting segments.

Tile first conventional magneto-optical disk head system includes a signal detecting circuit for detecting an information signal and focusing and tracking error signals of the magneto-optical disk. In the signal detecting circuit, each of the photodetecting segments of the photodetector consists of a photodiode having a cathode corresponding to an electrode of a top surface and an anode corresponding to an electrode of a bottom surface. Cathodes of the photodetecting segments are connected in common to a bias power supply by which the signal detecting circuit is applied with a bias voltage. Low frequency components of signals supplied from the anodes of the photodetecting segments give the focusing and tracking error signals, respectively. On the other hand, high frequency components of signals supplied from the anodes thereof give the information signal by which data recorded on the magneto-optical disk are able to be playbacked.

second conventional magneto-optical disk head system has been disclosed in the text 30a-G-5 of Extended Abstracts (The 37th Autumn Meeting, 1990); The Japan Society of Applied Physics. The second conventional magneto-optical disk headsystem includes a semiconductor laser, a collimator lens, an objective lens, a beam splitter, a lens, a holographic element and a photodetector.

In operation, a laser light emitted from the semiconductor laser is transmitted through an optical system consisting of the collimator lens, the b earn splitter and the objective lens to be focused on a magneto-optical disk. A reflection light of the laser light reflected at the magneto-optical disk reaches the beam splitter at which the reflection light changes its direction toward the photodetector through the lens and the holographic element. The reflection light is divided by the holographic element to three lights, first one being a non-diffracted light (zeroth order diffracted light) whose polarization direction is orthogonal to an optical axis of a crystal composing the holographic element, and second and third ones being ±1st order diffracted lights whose polarization directions are parallel to the optical axis of the crystal. These three lights are detected by the photodetector.

The photodetector of the second conventional magneto-optical disk head system includes an N-layer grown by epitaxy on an N+-silicon substrate, and three P-layers formed within the N-layer. The three P-layers compose three islanded segment regions for detecting the zeroth order and ±1st order diffracted lights, respectively. Each islanded segment region consists of several photodetecting segments.

The second conventional magneto-optical disk head system includes a signal detecting circuit for detecting an information signal and focusing and tracking error signals of the magneto-optical disk. In the signal detecting circuit, each of the photodetecting segments of the photodetector consists of a photodiode having a cathode corresponding to an electrode of a top surface and an anode corresponding to an electrode of a bottom surface. Cathodes of the photodetecting segments are connected in common to a bias power supply by which the signal detecting circuit is applied with a bias voltage. Low frequency components of signals supplied from anodes of the photodetecting segments give the focusing and tracking error signals, respectively. On the other hand, high frequency components of signals supplied from the anodes thereof give the information signal.

According to the first and second conventional magneto-optical disk head systems, however, there is a disadvantage in that the information signal and the focusing and tracking error signals are badly affected by each other by noises generated by the circuits for detecting these signals, because these three signals are detected through the common anodes of the photodetecting segments of the photodetector. As a result, the quality of the signals become deteriorated.

SUMMARY OF THE INVENTION

Accordingly, it is an object of the invention to provide a magneto-optical disk head system in which the high quality of an information signal and focusing and tracking error signals can be obtained by avoiding the interference of these signals due to noises generated by circuits for detecting these signals.

According to a feature of the invention, a magneto-optical disk head system comprises:
 a laser light source for emitting a laser light;
 an optical system for focusing the laser light emitted from the laser light source on a magneto-optical disk;

means for separating a reflection light of the laser light reflected at the magneto-optical disk to a plurality of polarized lights having orthogonal polarization directions; and a photodetector for detecting the plurality of polarized lights, the photodetector comprising a plurality of photodetecting segments each of which consisting of a photodiode isolated from each other;

wherein an information signal of the magneto-optical disk is detected through cathodes of the plurality of photodetecting segments; and focusing and tracking error signals of the magneto-optical disk are detected through anodes of the plurality of photodetecting segments.

BRIEF DESCRIPTION OF THE DRAWINGS

The invention will be explained in more detail in conjunction with appended drawings wherein.

DESCRIPTION OF THE PREFERRED EMBODIMENTS

Before describing a magneto-optical disk head system in preferred embodiments according to the invention, the conventional magneto-optical disk head systems described before will be explained in conjunction with FIGS. 1 to 10.

Figure 1:
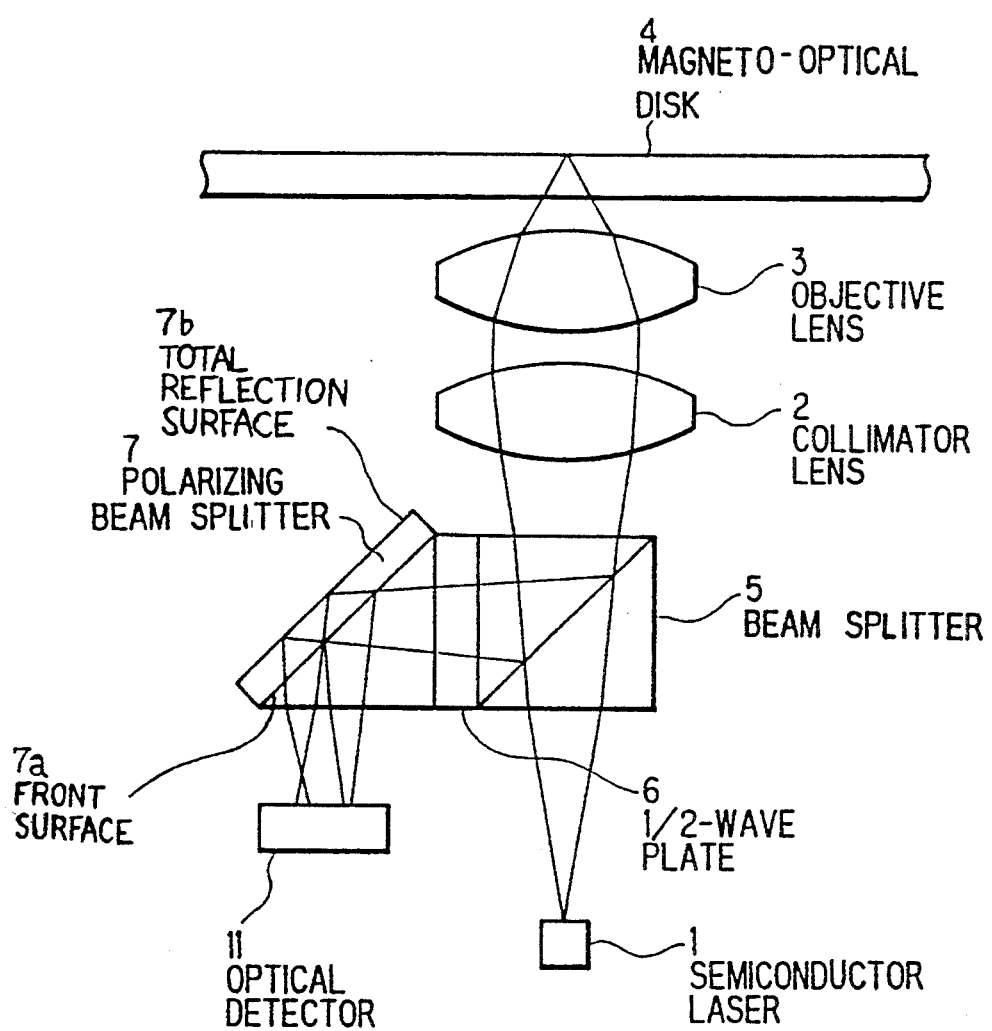
FIG. 1 is a schematic diagram illustrating a first conventional magneto-optical disk head system.

FIG. 1 shows a first conventional magneto-optical disk head system. The magneto-optical disk head system includes a semiconductor laser 1, a collimator lens 2, an objective lens 3, a beam splitter 5, a half-wave plate 6, a polarizing beam splitter 7 and a photodetector 11.

In operation, a laser light emitted from the semiconductor laser 1 is transmitted through the beam splitter 5 and reaches the collimator lens 2. The laser light becomes a parallel light at the collimator lens 2 and then reaches the objective lens 3. The parallel light is focused by the objective lens 3 and supplies to a magneto-optical disk 4. A reflection light of the laser light reflected at the magneto-optical disk 4 is transmitted through the objective lens 3 and the collimator lens 2, and reaches the beam splitter 5. The reflection light reflects at the beam splitter 5 to change its direction to the half-wave plate 6. The half-wave plate 6 rotates the polarization plane of the reflection light by 45 degrees to spatially separate the reflection light to P-polarized and S-polarized lights which have orthogonal polarization directions. The P-polarized light is transmitted through a front surface 7a of the polarizing beam splitter 7 and reach a total reflection surface 7b thereof. Tile P-polarized light reflects at the total reflection surface 7b and is transmitted through the front surface 7a where the P-polarized light changes the direction toward the photodetector 11 to be detected. The S-polarized light directly reflects at the front surface 7a and changes the direction toward the photodetector 11 to be detected.

Figures 2A, 2B, 2C:
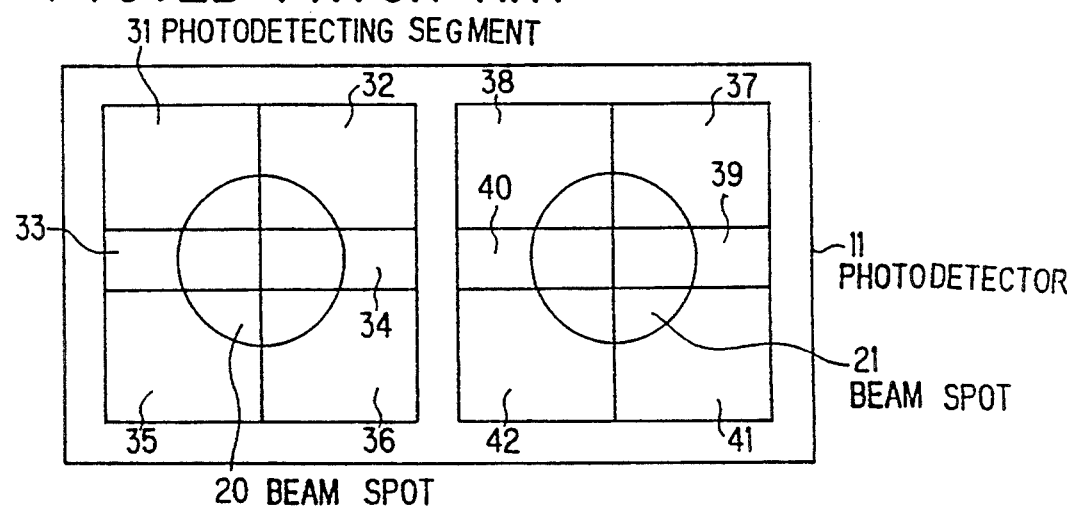
FIGS. 2A to 2C are explanatory plan views illustrating beam spots on photodetecting segments of a photodetector of the first conventional magneto-optical disk head system shown in FIG. 1.

FIGS. 2A to 2C show beam spots of the P-polarized and S-polarized lights on the photodetector pattern of the photodetector 11. The photodetector 11 includes two islanded segment regions 30a and 3Ob. The islanded segment region 30a for detecting the P-polarized light consists of photodetecting segments 31 to 36, while the islanded segment region 30b for detecting the S-polarized light consists of photodetecting segments 37 to 42. Two beam spots 20 and 21 corresponding to the P-polarized and S-polarized lights are focused on the islanded segment regions 30a and 30b, respectively.

Sizes of the beam spots 20 and 21 change in accordance with the change in the focus state on the magneto-optical disk 4. The two beam spots 20 and 21 have almost the same size, when the disk 4 is in the focus position, as shown in FIG. 2B. However, the beam spot 20 becomes larger than the beam spot 21, when the disk 4 is over the focus position, as shown in FIG. 2A. On the other hand, the beam spot 20 becomes smaller than the beam spot 21, when the disk 4 is under the focus position, as shown in FIG. 2C.

Therefore, appropriate combinations of the outputs of the photodetecting segments 81 to 42 give a focusing error signal, a tracking error signal and an information signal. The focusing error signal is given by $(V(31)+V(32)+V(35)+V(36)+V(39)+V(40))-(V(33)+V(34)+V(37)+V(38)+V(41)+V(42))$, according to the spot size detection method, where $V(31)$ to $V(42)$ are outputs of the photodetecting segments 31 to 42, respectively. The tracking error signal is given by either or a sum of $(V(31)+V(33)+V(35))-(V(32)+V(34)+V(36))$ and $(V(37)+V(39)+V(41))-(V(38)+V(40)+V(42))$, according to the push-pull method. The information signal is given by an optical power difference between the two beam spots 20 and 21, that is $(V(31)+V(32)+V(33)+V(34)+V(35)+V(36))-(V(37)+V(38)+V(39)+V(40)+V(41)+V(42))$.

Figure 3:
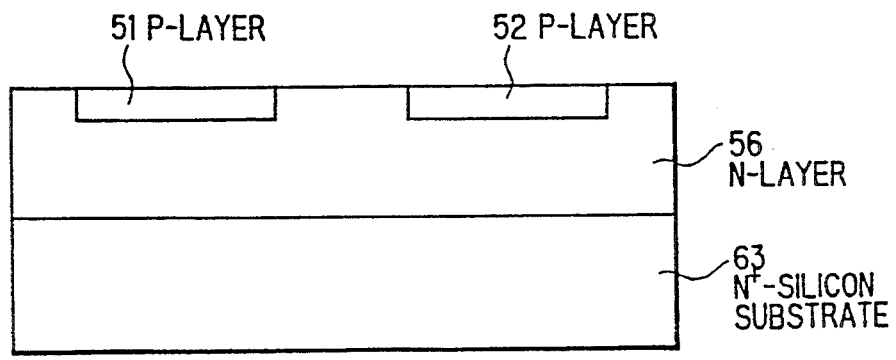
FIG. 3 is a cross-sectional view illustrating the photodetector of the first conventional magneto-optical disk head system shown in FIG. 1.

FIG. 3 shows a cross-section of the photodetector 11. The photodetector 11 includes an N-layer 56 which is a conductive layer grown on an N+-silicon substrate 63 by epitaxy, and P-layers 51 and 52 formed within the N-layer 56 in the vicinity of the surface thereof. The P-layers 51 and 52 correspond to the islanded segment regions 30a and 30b, respectively.

Figure 4:
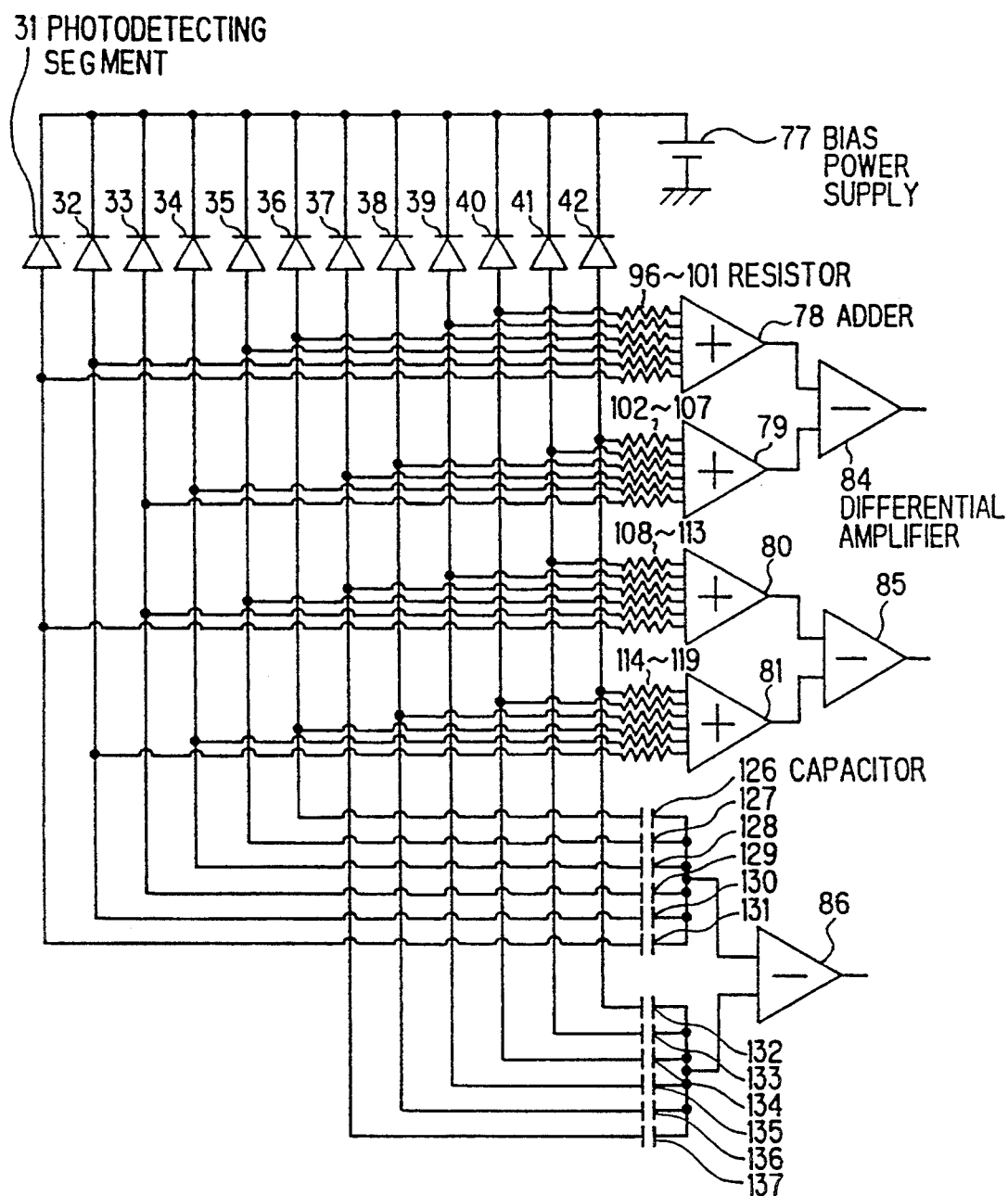
FIG. 4 is a block diagram of a signal detecting circuit of the first conventional magneto-optical disk head system shown in FIG. 1.

FIG. 4 shows a signal detecting circuit for detecting the information signal and the focusing and tracking error signals in the first conventional magneto-optical disk head system. In the signal detecting circuit, each of the photodetecting segments 31 to 42 consists of a photodiode having a cathode corresponding to an electrode of a top surface and an anode corresponding to an electrode of a bottom surface. Cathodes of the photodetecting segments 31 to 42 are connected in common to a positive terminal of a bias power supply 77 by which the signal detecting circuit is applied with a bias voltage. Anodes of the photodetecting segments 31, 32, 35, 36, 39 and 40 are connected to input terminals of an adder 78 through resistors 96 to 101, respectively. Anodes of the photodetecting segments 33, 34, 37, 38, 41 and 42 are connected to input terminals of an adder 79 through resistors 102 to 107, respectively. Anodes of the photodetecting segments 31, 33, 35, 37, 39 and 41 are connected to input terminals of an adder 80 through resistors 108 to 113, respectively. Anodes of the photodetecting segments 32, 34, 36, 38, 40 and 42 are connected to input terminals of an adder 81 through resistors 114 to 119, respectively. Output terminals of the adders 78 and 79 are connected to input terminals of a differential amplifier 84. Output terminals of the adders 80 and 81 are connected to input terminals of a differential amplifier 85. Anodes of the photodetecting segments 31 to 36 are connected to one of two input terminals of a differential amplifier 86 through capacitors 126 to 131, respectively. Anodes of the photodetecting segments 37 to 42 are connected to the other of the two input terminals of the differential amplifier 86 through capacitors 132 to 137, respectively. Low frequency components of outputs of the differential amplifiers 84 and 85 give the focusing and tracking error signals, respectively. On the other hand, high frequency components of outputs of the differential amplifier 86 give the information signal.

Figure 5:
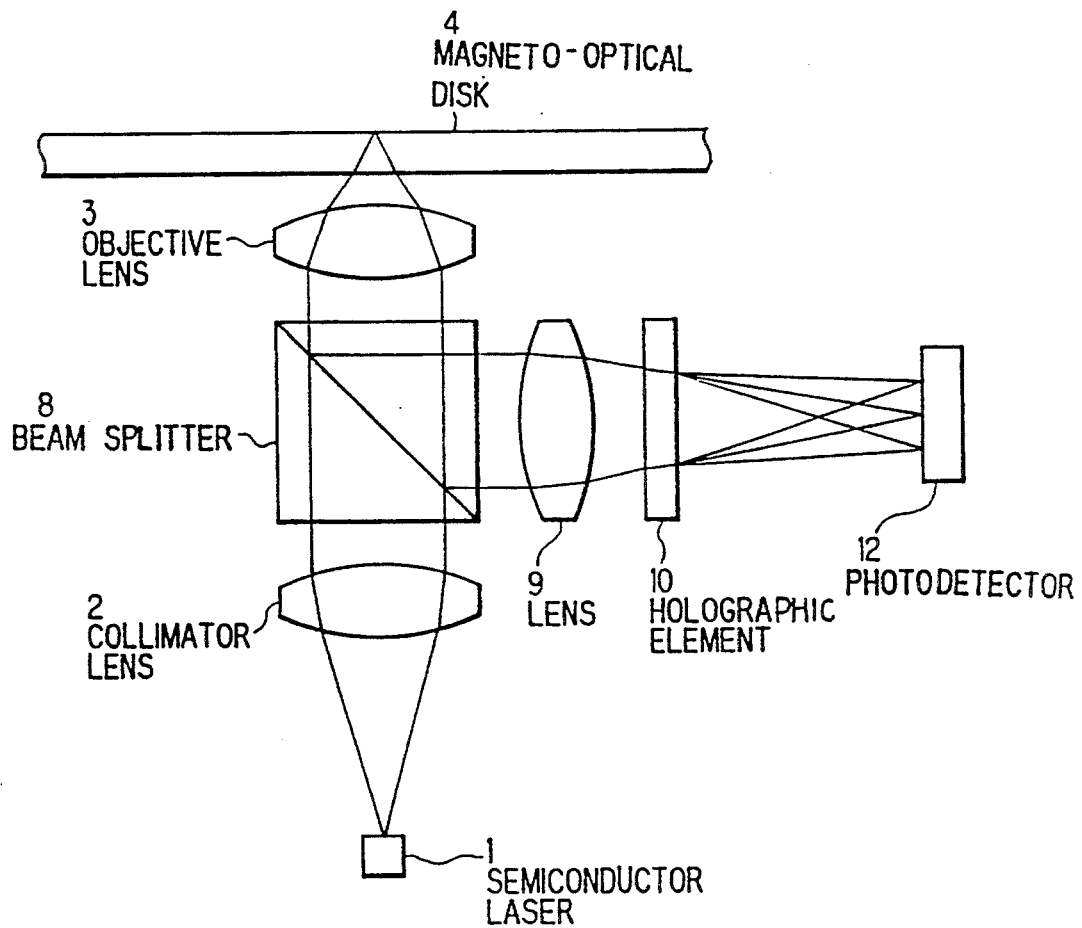
FIG. 5 is a schematic diagram illustrating a second conventional magneto-optical disk head system.

FIG. 5 shows a second conventional magneto-optical disk head system. The magneto-optical disk head system includes a semiconductor laser 1, a collimator lens 2, an objective lens 3, a beam splitter 8, a lens 9, a holographic element 10 and a photodetector 12.

In operation, a laser light emitted from the semiconductor laser 1 becomes a parallel light at the collimator lens 2, and then is transmitted through the beam splitter 8. The parallel light is focused by the objective lens 3 and suppliedto a magneto-optical disk 4. A reflection light of the laser light reflected at the magneto-optical disk 4 is transmitted through the objective lens 3 and reaches the beam splitter 8. The reflection light reflects at the beam splitter 8 to change the direction toward the lens 9 and reaches the holographic element 10 through the lens 9. The holographic element 10 consists of birefringent crystal whose optical axis forms an angle of 90 degrees with the polarization direction of a polarized light irradiated from outside, so that the reflection light is divided to three lights, first one being a non-diffracted light (zeroth order diffracted light) whose polarization direction is orthogonal to the optical axis of the crystal, and second and third ones being ±1th order diffracted lights whose polarization directions are parallel to the optical axis of the crystal. These three lights are detected by the photodetector 12.

Figure 6:
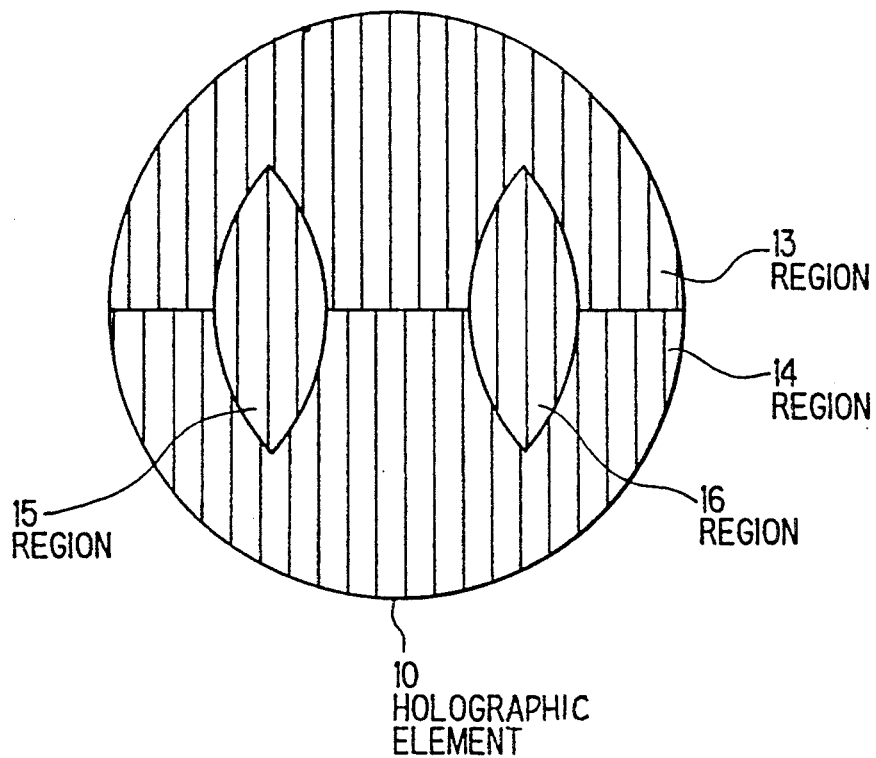
FIG. 6 is an explanatory plan view illustrating a holographic element of the second conventional magneto-optical disk head system shown in FIG. 5.

FIG. 6 shows a plan view of the holographic element 10. The holographic element 10 is divided to four regions 13 to 16, so that the ±1th order diffracted lights generated by the holographic element 10 are divided to four beams each of which corresponds to each of the regions 13 to 16. The regions 13 and 14 are divided by a line vertical to the tracking direction of the magneto-optical disk 4. The regions 15 and 16 each of which is a boat-shaped region are located symmetrical to each other with the track of the magneto-optical disk 4.

Figure 7:
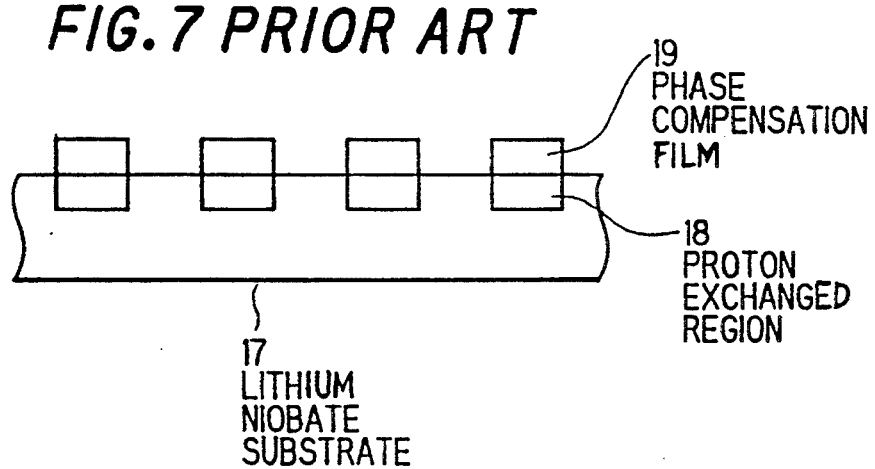
FIG. 7 is a cross-sectional view illustrating the holographic element of the second conventional magneto-optical disk head system shown in FIG. 5.

FIG. 7 shows a cross-section of the holographic element 10. The holographic element 10 includes a plurality of proton exchanged regions 18 formed periodically within a lithium niobate substrate 17 consisting of a birefringent crystal in the vicinity of the surface thereof, and phase compensation films 19 formed on each of the proton exchanged regions 18.

When an ordinary light whose polarization direction is vertical to the optical axis of the lithium niobate substrate 17 of the holographic element 10 is irradiated to the holographic element 10, the ordinary light will not diffract thereat and become a zeroth order diffracted light therein, because a phase difference between the light which transmitted through an area in the holographic 10 including the proton exchanged regions 18 and the light which is transmitted through an area therein not including the proton exchanged regions 18 is 0°. On the other hand, an extraordinary light whose polarization direction is parallel to the optical axis of the lithium niobate substrate 17 of the holographic element 10 is irradiated to the holographic element 10, the extraordinary light will completely diffract thereat and become ±1th order diffracted lights.

Figure 8A:
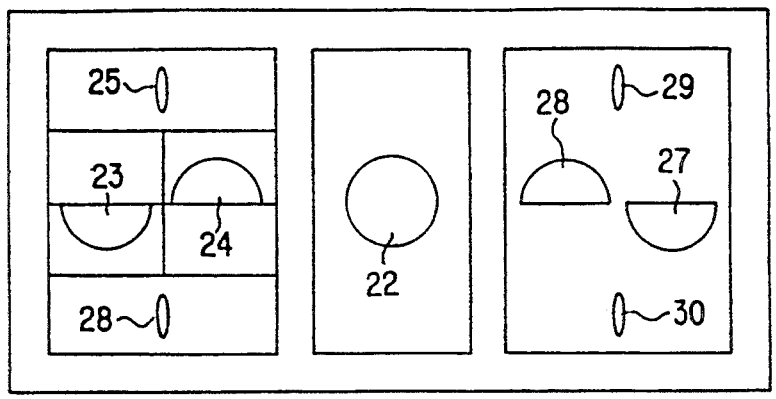
FIGS. 8A to 8C are explanatory plan views illustrating beam spots on photodetecting segments of a photodetector of the second conventional magneto-optical disk head system shown in FIG. 5.
Figure 8B:
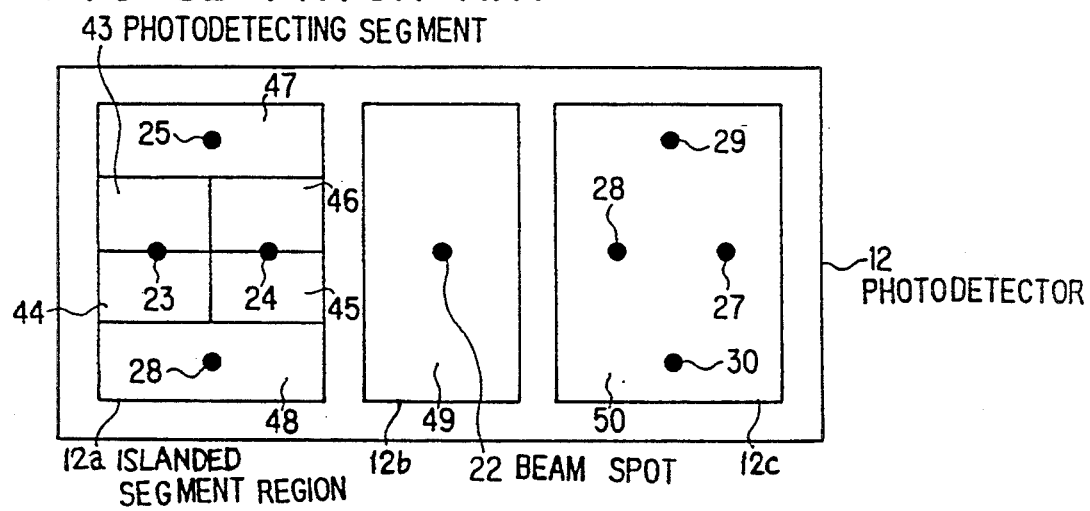
Figure 8C:
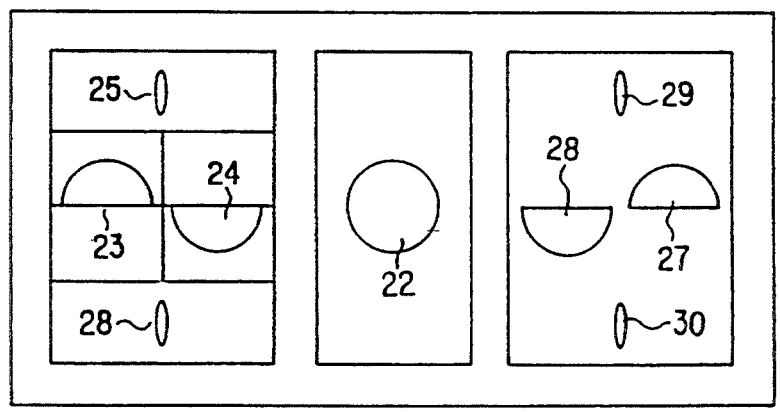

FIGS. 8A to 8C show beam spots of the zeroth order and ±1st order diffracted lights on the photodetector patterns of the photodetector 12. The photodetector 12 includes three islanded segment regions 12a to 12c. The islanded segment region 12a for detecting the +1st order diffracted light consists of photodetecting segments 43 to 48, the island segment region 12b for detecting the zeroth order diffracted light consists of a photodetecting segment 49, and the islanded segment region 12c for detecting the −1th order diffracted light consists of a photodetecting segment 50. A beam spot 22 on the islanded segment region 12b corresponds to the zeroth order diffracted light, beam spots 23 to 26 on the islanded segment region 12a correspond to the +1st order diffracted light being transmitted through the regions 13 to 16 of the holographic element 10, and beam spots 27 to 30 on the islanded segment region 12c correspond to the −1st order diffracted light being transmitted through the regions 13 to 16 of the holographic element 10, respectively.

Sizes and locations of the beam spots 22 to 30 change in accordance with the change in the focus state of the magneto-optical disk 4. When the disk 4 is in the focus position, the beam spot 22 is at the center of the photodetecting segment 49 (the islanded segment region 12b), the beam spot 23 is on the line separating the photodetecting segments 43 and 44, the beam spot 24 is on the line separating the photodetecting segments 45 and 46, the beam spots 25 and 26 are at the centers of the photodetecting segments 47 and 48 respectively, and the beam spots 27 to 30 are within the photodetecting segment 50 (the islanded segment region 12c), and all the beam spots 22 to 30 have narrow pointed areas, as shown in FIG. 8B. When the disk 4 is over the focus position, the beam spots become larger. The beam spot 22 becomes a disk-shaped spot, each of the beam spots 23, 24, 27 and 28 becomes a half-moon-shaped spot, and each of the beam spots 25, 26, 29 and 30 becomes an oval-shaped spot, as shown in FIG. 8A. The beam spots 22 and 25 to 30 remain within the corresponding photodetecting segments as they are in FIG. 8B, however, the beam spots 23 and 24 shift to locate within the photodetecting segments 44 and 46, respectively. When the disk 4 is under the focus position, each of the beam spots 22 to 30 has the same shape as in FIG. 8A, however, the beam spots 23, 24, 27 and 28 change their locations, as shown in FIG. 8C.

The beam spots 27 and 28 remain within the photodetecting segment 50, however, the beam spots 23 and 24 move from the photodetecting segments 44 and 46 to the photodetecting segments 43 and 45, respectively.

Therefore, the focusing error signal is given by $(V(43)+V(45))-(V(44)+V(46))$, according to the Foucault's method. The tracking error signal is given by $V(47)-V(48)$, according to the push-pull method. The information signal is given by an optical power difference between the beam spot 22 and a sum of the beam spots 23 to 30, that is $V(49)-(V(43)+V(44)+V(45)+V(46)+V(47)+V(48)+V(50))$. Where $V(43)$ to $V(50)$ are outputs of the photodetecting segments 43 to 50, respectively.

Figure 9:
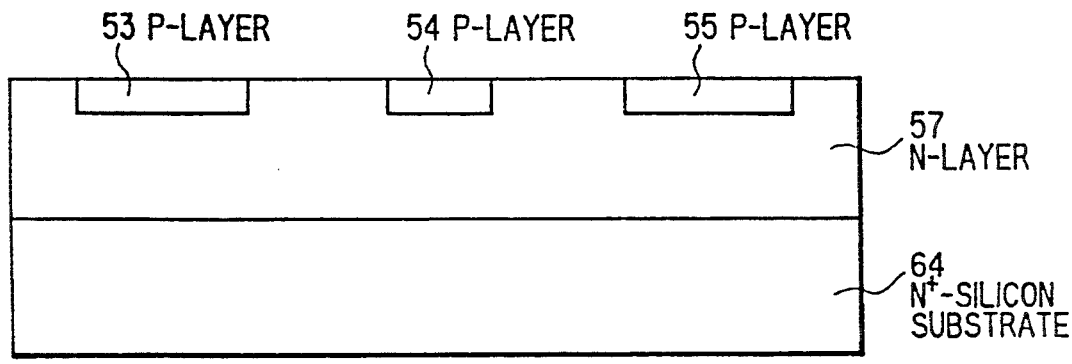
FIG. 9 is a cross-sectional view illustrating the photodetector of the second conventional magneto-optical disk head system shown in FIG. 5.

FIG. 9 shows a cross-section of the photodetector 12. The photodetector 12 includes an N-layer 57 which is a conductive layer grown on an N+-silicon substrate 64 by epitaxy, and P-layers 53 to 55 formed within the N-layer 57 in the vicinity of the surface thereof. The P-layers 53 to 55 correspond to the islanded segment regions 12a to 12c, respectively.

Figure 10:
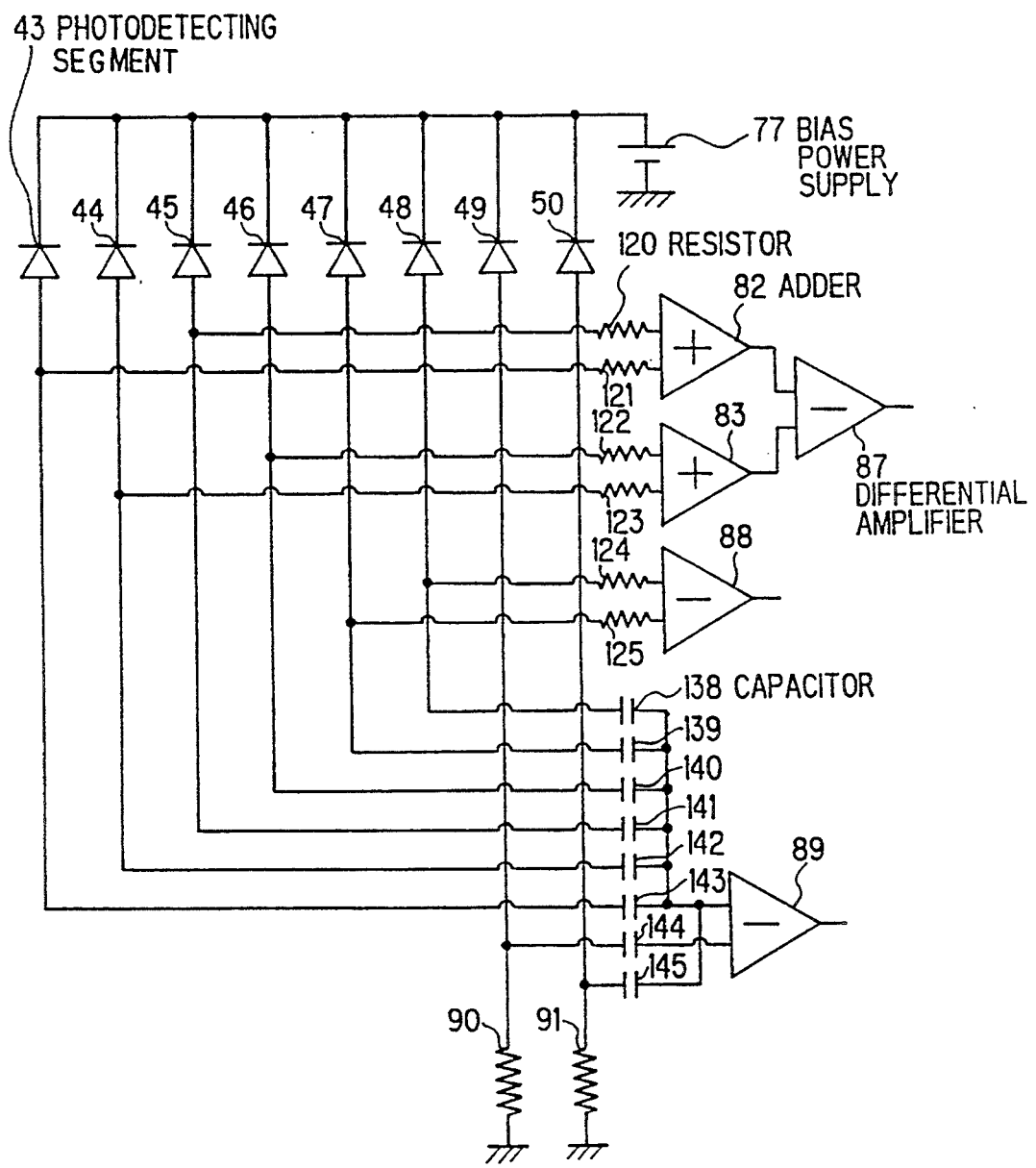
FIG. 10 is a block diagram of a signal detecting circuit of the second conventional magneto-optical disk head system shown in FIG. 5.

FIG. 10 shows a signal detecting circuit of the second conventional magneto-optical disk head system. In the signal detecting circuit, each of the photodetecting segments 43 to 50 consists of a photodiode having a cathode corresponding to an electrode of a top surface and an anode corresponding to an electrode of a bottom surface. Cathodes of the photodetecting segments 43 to 50 are connected in common to a bias power supply 77 by which the signal detecting circuit is applied with a bias voltage. Anodes of the photodetecting segments 43 and 45 are connected to input terminals of an adder 82 through resistors 120 and 121, respectively. Anodes of the photodetecting segments 44 and 46 are connected to input terminals of an adder 83 through resistors 122 and 123, respectively. Output terminals of the adders 82 and 88 are connected to input terminals of a differential amplifier 87. Anodes of the photodetecting segments 47 and 48 connected to input terminals of a differential amplifier 88 through resistors 124 and 125, respectively. Anodes of the photodetecting segments 43 to 48 and 50 are connected to one of two input terminals of a differential amplifier 89 through capacitors 143 to 138 and 145, respectively. An anode of the photodetecting segment 49 is connected to the other of the two input terminals of the differential amplifier 89 through a capacitor 144, respectively. The anodes of the photodetecting segments 49 and 50 are connected to ground through resistors 90 and 91, respectively. Low frequency components of outputs of the differential amplifiers 87 and 88 give the focusing and tracking error signals, respectively. On the other hand, high frequency components of outputs of the differential amplifier 89 gives the information signal.

Next, a magneto-optical disk head system in a first preferred embodiment will be explained. The basic structure of the magneto-optical disk head system in the first preferred embodiment is the same as that in the first conventional magneto-optical disk head system shown in FIG. 1, except that the structure of a photodetector in the first preferred embodiment is different from that in the first conventional magneto-optical disk head system.

Figure 11:
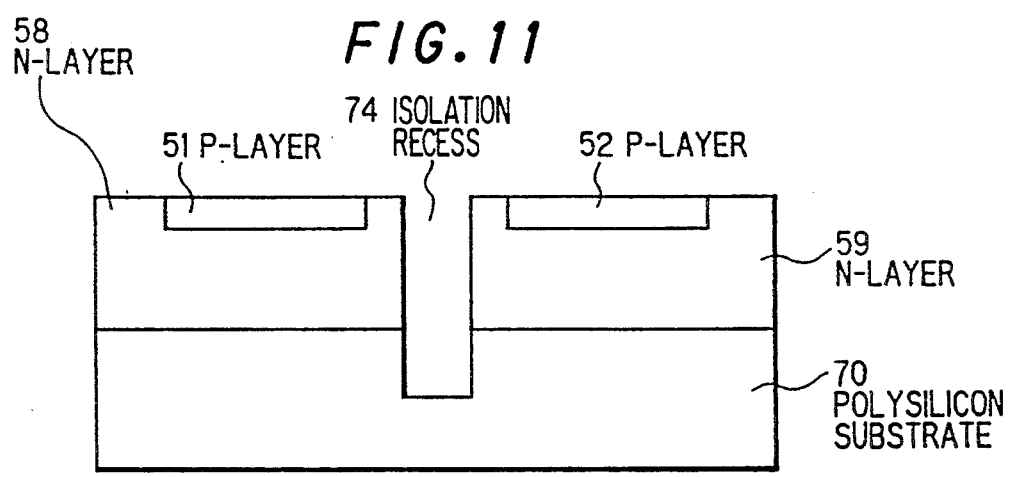
FIG. 11 is a cross-sectional view illustrating a photodetector of a magneto-optical disk head system in a first preferred embodiment according to the invention.

FIG. 11 shows a cross-section of the photodetector of the magneto-optical disk head system in the first preferred embodiment. The photodetector includes N-layers 58 and 59 grown by epitaxy on a polysilicon substrate 70 which is an insulation material. The N-layers 58 and 59 are isolated from each other by an isolation recess 74 whose bottom is located in the middle of the polysilicon substrate 70 in depth. P-layers 51 and 52 are formed within the N-layers 58 and 59 in the vicinity of the surface thereof, respectively. The P-layers 58 and 59 correspond to the islanded segment regions 30a and 30b of the photodetector 11 shown in FIGS. 2A to 2C, respectively.

The photodetector includes two islanded segment regions 30a and 30b consisting of photodetecting segments 31 to 36 and 37 to 42, respectively, which is the same as the photodetector 11 of the magneto-optical disk head system in the first preferred embodiment shown in FIGS. 2A to 2C. Figures of beam spots of laser lights emitted from a semiconductor laser 1 are the same as those shown in FIGS. 2A to 2C, and sizes of the beam spots change in accordance with the change in the focus state on the magneto-optical disk 4, as like in the first conventional magneto-optical disk head system, so that the explanation will not be repeated again.

Figure 12:
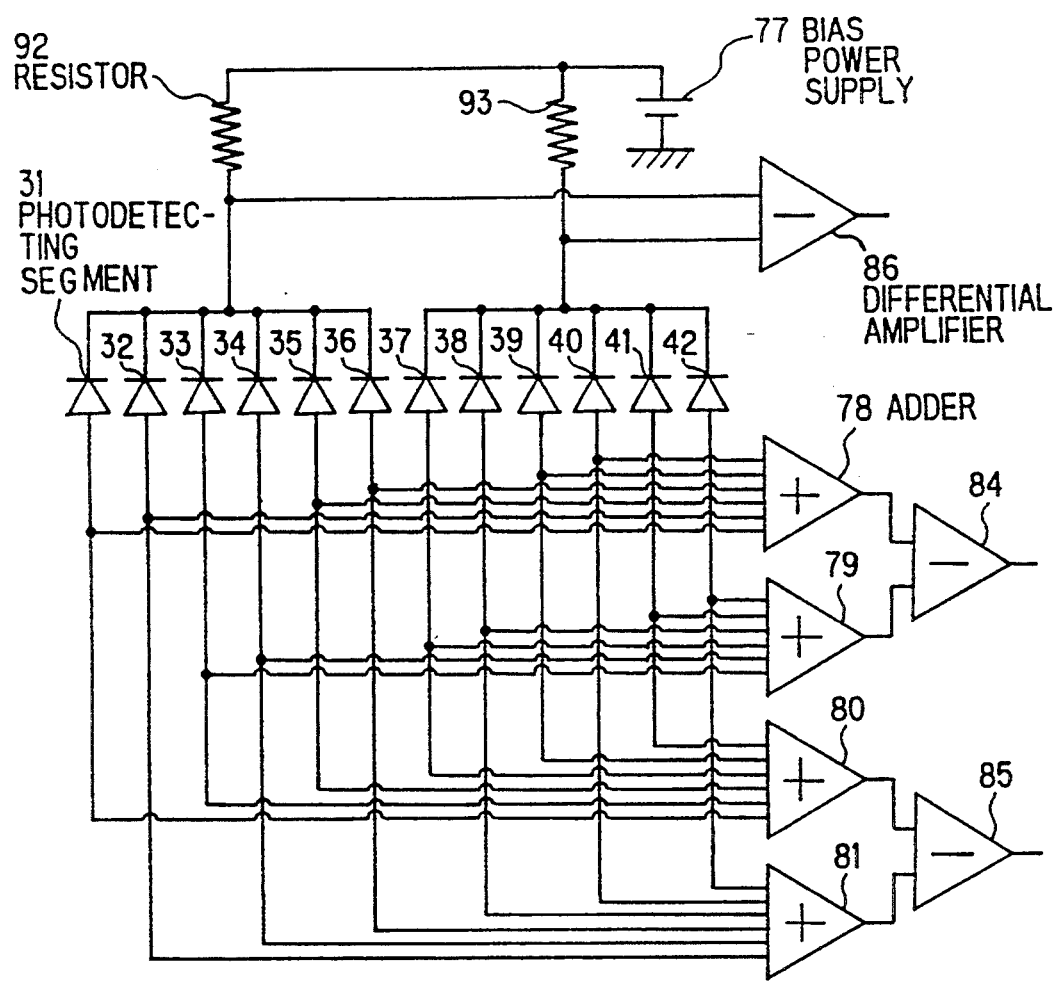
FIG. 12 is a block diagram of the signal detecting circuit of the magneto-optical disk head system in the first preferred embodiment according to the invention.

FIG. 12 shows a signal detecting circuit of the magneto-optical disk head system in the first preferred embodiment. Cathodes of the photodetecting segments 31 to 36 are connected in common to both a first terminal of a resister 92 and a first input terminal of a differential amplifier 86, while cathodes of the photodetecting segments 37 to 42 are connected in common to both a first terminal of a resistor 93 and a second input terminal of the differential amplifier 86. Second terminals of the resistors 92 and 93 are connected to a positive terminal of a bias power supply 77 by which the signal detecting circuit is applied with a bias voltage. Anodes of the photodetecting segments 31, 32, 35, 36, 39 and 40 are connected to input terminals of an adder 78, anodes of the photodetecting segments 33, 34, 37, 38, 41 and 42 are connected to input terminals of an adder 79, anodes of the photodetecting segments 31, 33, 35, 37, 39 and 41 are connected to input terminals of an adder 80, and anodes of the photodetecting segments 32, 34, 36, 38, 40 and 42 are connected to input terminals of an adder 81. Output terminals of the adders 78 and 79 are connected to input terminals of a differential amplifier 84, and output terminals of the adders 80 and 81 are connected to input terminals of a differential amplifier 85. Outputs of the differential amplifiers 84 and 85 give the focusing and tracking error signals, respectively. On the other hand, an output of the differential amplifier 86 gives the information signal.

In the magneto-optical disk head system in the first preferred embodiment, the N-layers 58 and 59 of the photodetector each of which corresponds to a cathode of the photodiode composing the photodetector are isolated from each other by the isolation recess 74, and the N-layers 58 and 59 are formed on the polysilicon substrate 70 which is an insulation material, so that signals from the islanded segment regions 30a and 30b are completely separated from each other. Consequently, it is possible to get the information signal from the cathodes of the photodetecting segments 31 to 42 by amplifying a difference of a sum of signals front the cathodes 31 to 36 and a sum of signals from the cathodes 37 to 42, as shown in FIG. 12. The focusing and tracking error signals are given from the anodes of the photodetecting segments 31 to 42, which are the same as in the conventional magneto-optical disk head systems, so that the information signal and the focusing and tracking error signals are prevented from interferences due to noises generated by the circuits for detecting these signals.

Next, a magneto-optical disk head system in a second preferred embodiment will be explained. The basic structure of the magneto-optical disk head system in the second preferred embodiment is the same as that in the second conventional magneto-optical disk head system shown in FIG. 5, except that the structure of a photodetector in the second preferred embodiment is different from that in the second conventional magneto-optical disk head system.

Figure 13:
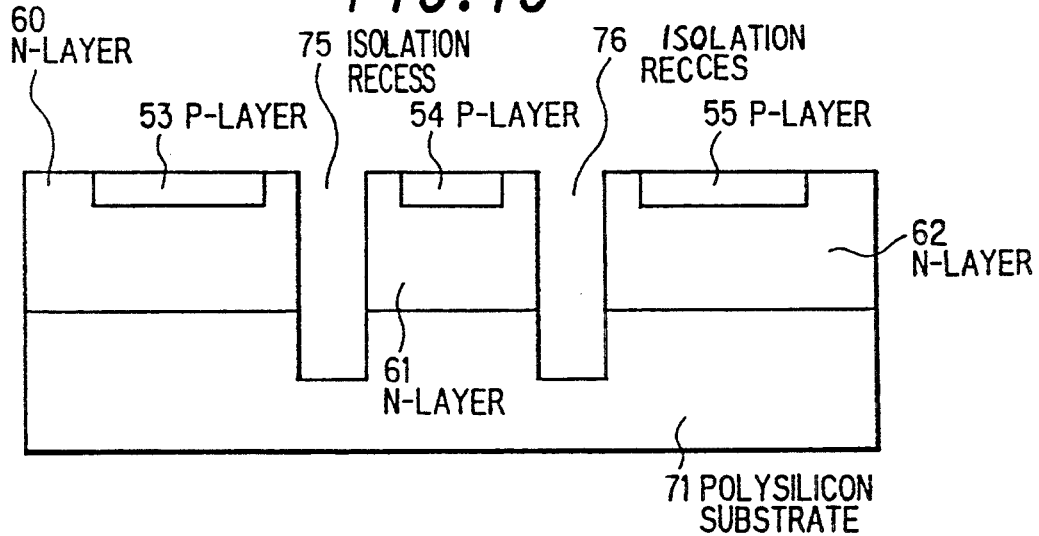
FIG. 13 is a cross-sectional view illustrating a photodetector of a magneto-optical disk head system in a second preferred embodiment according to the invention.

FIG. 13 shows a cross-section of the photodetector of the magneto-optical disk head system in the second preferred embodiment. The photodetector includes N-layers 60 to 62 grown by epitaxy on a polysilicon substrate 71 which is an insulation material. The N-layers 60 to 62 are isolated from each other by isolation recesses 75 and 76 whose bottoms are located in the middle of the polysilicon substrate 71 in depth. P-layer 53 to 55 are formed within the N-layers 60 to 62 in the vicinity of the surface thereof, respectively. The P-layers 53 to 55 correspond to the islanded segment regions 12a to 12c of the photodetector 11 shown in FIGS. 8A to 8C, respectively.

The photodetector includes three islanded segment regions 12a to 12c consisting of photodetecting segments 43 to 48, 49 and 50, respectively, which is the same as the photodetector 11 of the magneto-optical disk head system in the second preferred embodiment shown in FIGS. 8A to 8C. Figures of beam spots of laser lights emitted from a semiconductor laser 1 are the same as those shown in FIGS. 8A to 8C. Sizes, shapes and locations of the beam spots change in accordance with the change in the focus state on the magneto-optical disk 4, as like in the second conventional magneto-optical disk head system. Therefore, the explanation will not be repeated again.

Figure 14:
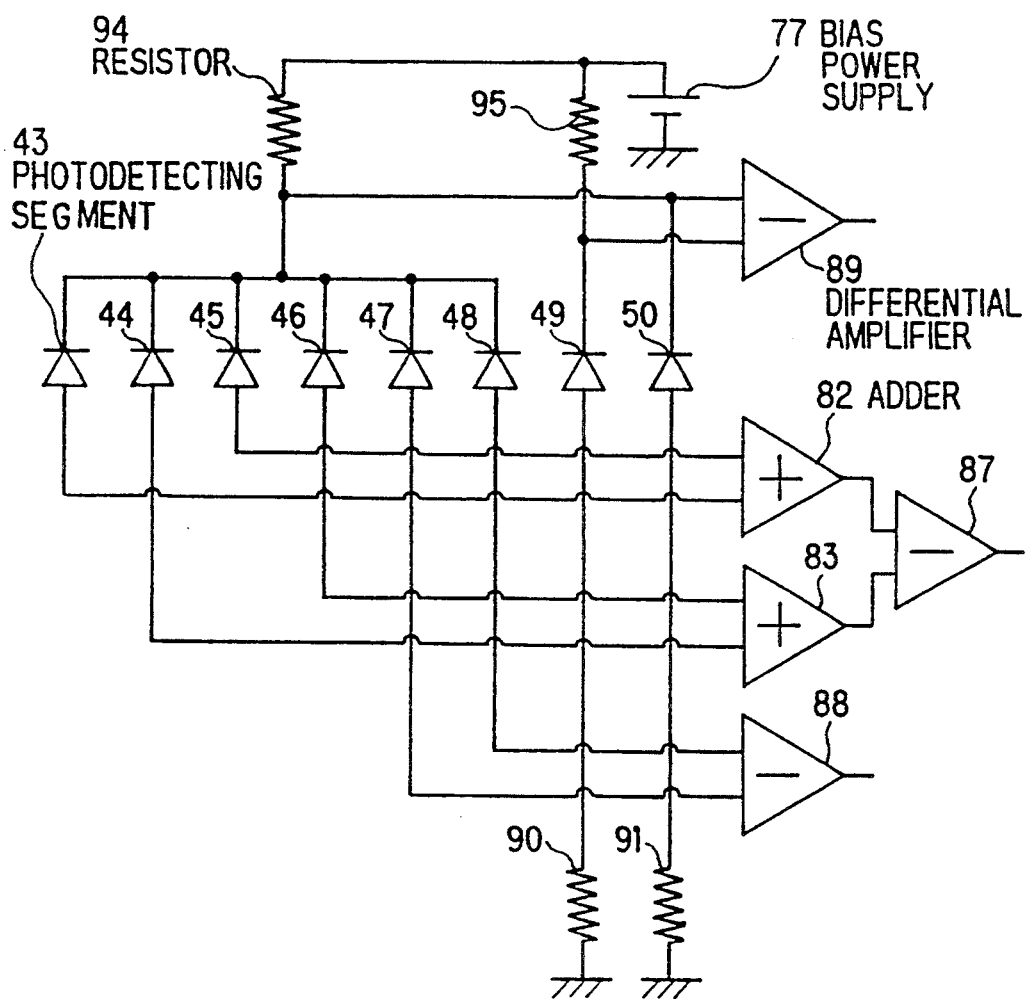
FIG. 14 is a block diagram of a signal detecting circuit of the magneto-optical disk head system in the second preferred embodiment according to the invention.

FIG. 14 shows a signal detecting circuit of the magneto-optical disk head system in the second preferred embodiment. Cathodes of the photodetecting segments 43 to 48 and 50 are connected in common to both a first terminal of a resister 94 and a first input terminal of a differential amplifier 89, while a cathode of the photodetecting segment 49 is connected to both a first terminal of a resistor 95 and a second input terminal of the differential amplifier 89. Second terminals of the resistors 94 and 95 are connected to a positive terminal of a bias power supply 77 by which the signal detecting circuit is applied with a bias voltage. Anodes of the photodetecting segments 43 and 45 are connected to input terminals of an adder 82, and anodes of the photodetecting segments 44 and 46 are connected to input terminals of an adder 83. Output terminals of the adders 82 and 83 are connected to input terminals of a differential amplifier 87. Anodes of the photodetecting segments 47 and 48 are connected to input terminals of a differential amplifier 88. Anodes of the photodetecting segments 49 and 50 are connected to ground through resistors 90 and 91, respectively. Outputs of the differential amplifiers 87 and 88 give the focusing and tracking error signals, respectively. On the other hand, an output of the differential amplifier 89 gives the information signal.

In the magneto-optical disk head system in the second preferred embodiment, it is possible to get the information signal from the cathodes of the photodetecting segments 43 to 50 by amplifying a difference of a signal from the cathode of the photodetecting segment 49 and a sum of signals from the cathodes of the photodetecting segments 43 to 48 and 50, as shown in FIG. 14. The focusing and tracking error signals are given from the anodes of the photodetecting segments 43 to 50, so that the information signal and the focusing and tracking error signals are prevented from interferences due to noises generated by the circuits for detecting these signals, as like in the first preferred embodiment.

Next, a magneto-optical disk head system in a the preferred embodiment will be explained. The basic structure of the magneto-optical disk head system in the third preferred embodiment is the same as that in the first preferred embodiment, except that the structure of a photodetector in the third preferred embodiment is different from that in the first preferred embodiment.

Figure 15:
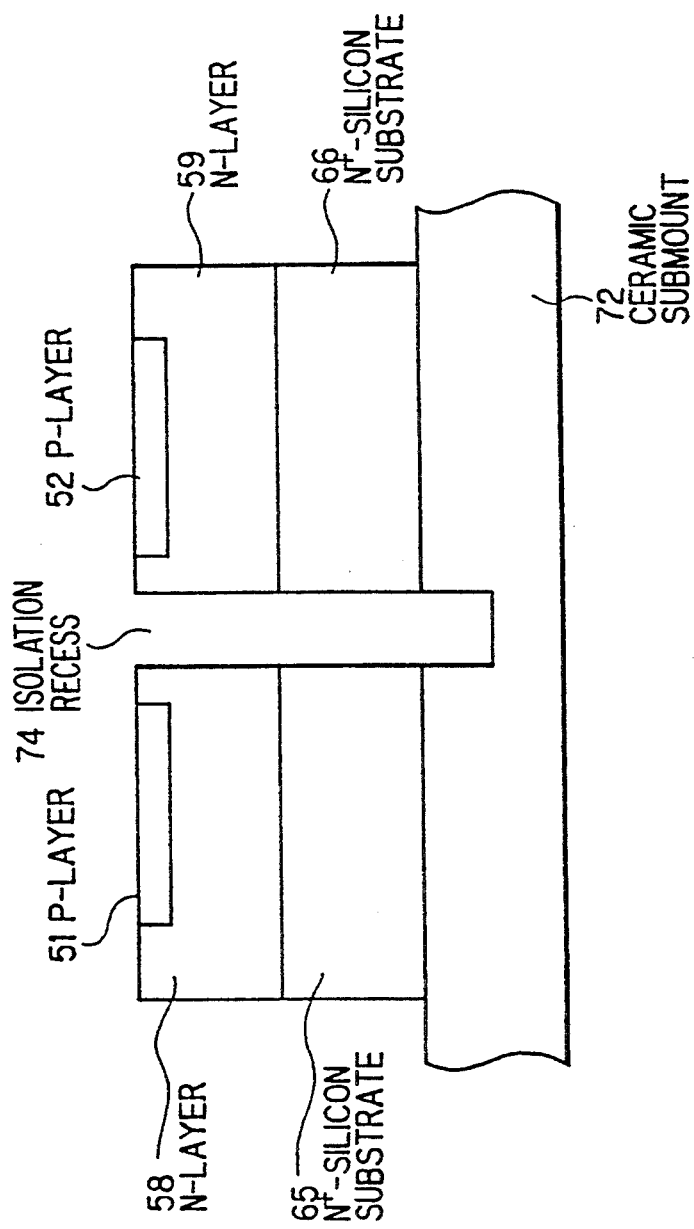
FIG. 15 is a cross-sectional view illustrating a photodetector of a magneto-optical disk head system in the second preferred embodiment according to the invention.

FIG. 15 shows a cross-section of the photodetector of the magneto-optical disk head system in the third preferred embodiment. The photodetector includes N-layers 58 and 59 grown by epitaxy on an N+-silicon substrates 65 and 66, respectively. P-layers 51 and 52 are formed within the N-layers 58 and 59 in the vicinity of the surface thereof, respectively. The P-layers 51 and 52 correspond to the islanded segment regions 30a and 30b of the photodetector 11 shown in FIGS. 2A to 2C, respectively. The N+-silicon substrates and 66 are fixed on a ceramic submount 72 which is an insulation material. A block consisting of the N-layer 58 and the N+-silicon substrate 65 is isolated from other block consisting of the N-layer 59 and the N+-silicon substrate 66 by an isolation recess 74 whose bottom is located in the middle of the ceramic submount 72 in depth.

The photodetector includes two islanded segment regions 30a and 30b consisting of photodetecting segments 31 to 36 and 37 to 42, respectively, which is the same as the photodetector 11 of the first conventional magneto-optical disk head system shown in FIGS. 2A to 2C. Figures of beam spots of laser lights emit ted from a semiconductor laser 1 are the same as those shown in FIGS. 2A to 2C. Sizes of the beam spots change in accordance with the change in the focus position on the magneto-optical disk 4, as like in the first conventional magneto-optical disk head system. Therefore, the explanation will not be repeated again.

The signal detecting circuit of the magneto-optical disk head system in the third preferred embodiment is the same as that in FIG. 12, so that further explanation will not be carried out here.

Next, a magneto-optical disk head system in a fourth preferred embodiment will be explained. The basic structure of the magneto-optical disk head system in the fourth preferred embodiment is the same as that in the second preferred embodiment, except that the structure of a photodetector in the fourth preferred embodiment is different from that in the second preferred embodiment.

Figure 16:
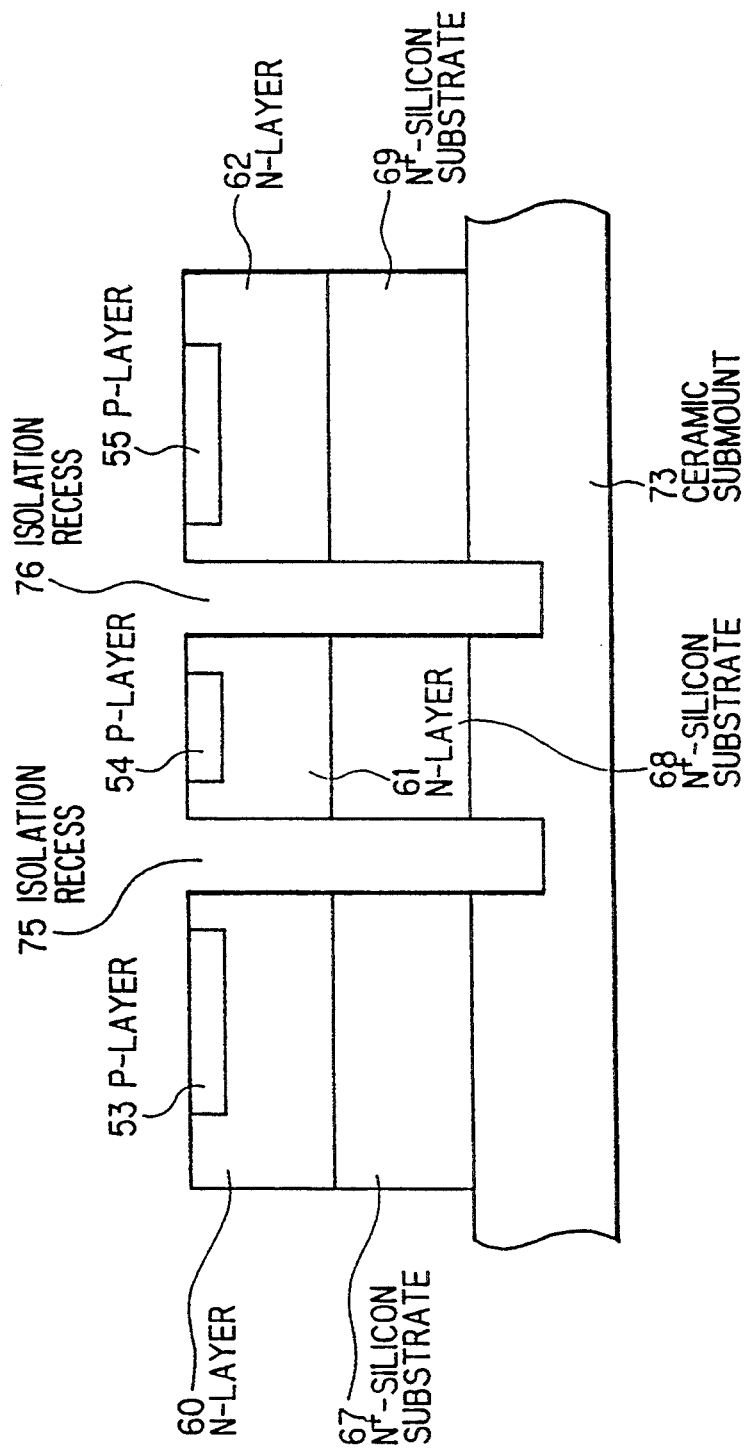
FIG. 16 is a cross-sectional view illustrating a photodetector of a magneto-optical disk head system in a fourth preferred embodiment according to the invention.

FIG. 16 shows a cross-section of the photodetector of the magneto-optical disk head system in the fourth preferred embodiment. The photodetector includes N-layers 60 to 62 grown by epitaxy on an N+-silicon substrates 67 to 69, respectively. P-layers 53 to 55 are formed within the N-layers 60 to 62 in the vicinity of the surface thereof, respectively. The P-layers 53 to 55 correspond to the islanded segment regions 12a to 12c of the photodetector 11 shown in FIGS. 8A to 8C, respectively. The N+-silicon substrates 67 to 69 are fixed on a ceramic submount 73 which is an isolation material. Three blocks, first of which consists of the N-layer 60 and the N+-silicon substrate 67, second of which consists of the N-layer 61 and the N+-silicon substrate 68 and third of which consists of the N-layer 62 and the N+-silicon substrate 69, are isolated from each other by isolation recesses 75 and 76 whose bottoms are located in the middle of the ceramic submount 73 in depth.

The photodetector includes three is landed segment regions 12a to 12c consisting of photodetecting segments 43 to 48, 49 and 50, respectively, which is the same as the photodetector 12 of the second conventional magneto-optical disk head system shown in FIGS. 8A to 8C. Figures of beam spots of laser lights emitted from a semiconductor laser 1 are the same as those shown in FIGS. 8A to 8C. Sizes, shapes and locations of the beam spots change in accordance with the change in the focus state on the magneto-optical disk 4, as like in the second conventional magneto-optical disk head system. Therefore, the explanation will not be repeated again.

The signal detecting circuit of the magneto-optical disk head system in the fourth preferred embodiment is the same as that in FIG. 14, so that further explanation will not be carried out here.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A magneto-optical disk head system, comprising:
a laser light source for emitting a laser light;
an optical system for focusing said laser light emitted from said laser light source on a magneto-optical disk;
means for separating a reflection light of said laser light reflected at said magneto-optical disk to a plurality of polarized lights having orthogonal polarization directions;
a photodetector for detecting said plurality of polarized lights, said photodetector comprising:
a plurality of photodetecting segments divided into plural groups, wherein each one of said plurality of photodetecting segments has a cathode, wherein the cathodes of photodetector segments within the same group are connected in common, and wherein each said photodetector segment is a photodiode comprised of;
an insulating substrate;
a cathode semiconductor layer formed on the insulating substrate; and
a plurality of anode semiconductor layer regions formed on the cathode semiconductor layer;
said cathode semiconductor layer being divided by recesses that extend from the top surface of the cathode semiconductor layer in close proximity to the anode semiconductor layer regions to the insulating substrate;
said magneto-optical disk head system further comprising:
information signal detecting means for detecting an information signal of said magneto-optical disk by performing a subtraction between a first sum obtained by adding cathode signals of a first group of said photodetecting segments and a second sum obtained by adding cathode signals of a second group of said photodetecting segments; and
error signal detecting means for producing focusing and tracking error signals of said magneto-optical disk by adding and subtracting anode signals of said first and second groups of said photodetecting segments.

2. A magneto-optical disk head system, according to claim 1, wherein:
each of said plurality of photodetecting segments of said photodetector comprises a first semiconductor layer of a first conductive type formed on an insulating substrate formed from an insulating substrate material and a second semiconductor layer of a second conductive type formed within said first semiconductor layer to have a hetero-junction, said hetero-junction supplied vertically with input light, and an output signal is obtained only from a photodetecting segment supplied with the input light.

3. A magneto-optical disk head system, according to claim 1, wherein:
each of said plurality of photodetecting segments of said photodetector comprises a first semiconductor layer of a first conductive type formed on a conductive substrate and a second semiconductor layer of a second conductive type formed within said first semiconductor layer to have a hetero-junction, said hetero-junction supplied vertically with input light, and an output signal is obtained only from a photodetecting segment supplied with the input light;
said conductive substrate is fixed on an insulating ceramic substrate; and
said plurality of photodetecting segments are isolated from each other by at least one recess.

4. A magneto-optical disk head system, according to claim 2 or 3, wherein:
said recess has a bottom locating in the middle of said insulating substrate in depth.

5. A magneto-optical disk head system as claimed in claim 1, in which said cathodes of said plurality of photodetecting segments are directly connected to inputs of a differential amplifier, the output of which gives said information signal.

6. A magneto-optical disk head system, comprising:

a laser light source for emitting a laser light;

an optical system for focusing said laser light emitted from said laser light source on a magneto-optical disk;

means for separating a reflection light of said laser light reflected at said magneto-optical disk to a plurality of polarized lights having orthogonal polarization directions; and a photodetector for detecting said plurality of polarized lights, said photodetector comprising a plurality of photodetecting segments each of which consists of a photodiode isolated from each other, said plurality of photodetecting segments being divided into a plurality of groups, wherein each one of said plurality of photodetecting segments has a cathode, wherein the cathodes of photodetector segments within the same group are connected in common;

wherein an information signal of said magneto-optical disk is detected from cathodes of said plurality of photodetecting segments;

focusing and tracking error signals of said magneto-optical disk are detected from anodes of said plurality of photodetecting segments;

wherein each of said plurality of photodetecting segments of said photodetector comprises a first semiconductor layer of a first conductive type formed on an insulating substrate and a second semiconductor layer of a second conductive type formed within said first semiconductor layer to have a hetero-junction;

said groups of said photodetecting segments are isolated from each other by at least one recess; and said recess has a bottom located in the middle of said insulating substrate in depth.

7. A magneto-optical disk head system, comprising:

a laser light source for emitting a laser light;

an optical system for focusing said laser light emitted from said laser light source on a magneto-optical disk;

means for separating a reflection light of said laser light reflected at said magneto-optical disk to a plurality of polarized lights having orthogonal polarization directions; and a photodetector for detecting said plurality of polarized lights, said photodetector comprising a plurality of photodetecting segments each of which consists of a photodiode isolated from each other, said plurality of photodetecting segments being divided into a plurality of groups, wherein each one of said plurality of photodetecting segments has a cathode, wherein the cathodes of photodetector segments within the same group are connected in common;

wherein an information signal of said magneto-optical disk is detected from cathodes of said plurality of photodetecting segments;

focusing and tracking error signals of said magneto-optical disk are detected from anodes of said plurality of photodetecting segments;

wherein each of said plurality of photodetecting segments of said photodetector comprises a first semiconductor layer of a first conductive type formed on a conductive substrate and a second semiconductor layer of a second conductive type formed within said first semiconductor layer to have a hetero-junction;

said conductive substrate is fixed on an insulating ceramic mount;

said groups of said photodetecting segments are isolated from each other by at least one recess; and said recess has a bottom located in the middle of said insulating substrate in depth.

8. A magneto-optical disk head system, according to claim 1, wherein the cathode semiconductor layers of different groups of said photodetecting elements are divided by said recesses, and the cathode semiconductor layers of photodetecting elements of the same group are not divided by said recesses therebetween.

* * * * *

UNITED STATES PATENT AND TRADEMARK OFFICE
CERTIFICATE OF CORRECTION

PATENT NO. : 5,426,626
DATED : June 20, 1995
INVENTOR(S) : Ryuichi Katayama

It is certified that error appears in the above-indentified patent and that said Letters Patent is hereby corrected as shown below:

Column 2, line 5 delete "b arn", insert --beam--

Column 3, line 65 delete "the second", insert --a third--

Column 4, line 63 delete "81", insert --31--

Column 5, line 64 delete "Suppliedto" insert --supplied to--

Column 7, line 62 delete "88", insert --83--

Column 10, line 62 delete "emit ted", insert --emitted--

Signed and Sealed this

Fourteenth Day of November, 1995

Attest:

BRUCE LEHMAN

*Attesting Officer*  *Commissioner of Patents and Trademarks*